United States Patent
Rim et al.

(10) Patent No.: US 12,136,676 B2
(45) Date of Patent: Nov. 5, 2024

(54) SCHOTTKY DIODE AND METHOD FOR FABRICATING THE SAME

(71) Applicant: POWER CUBESEMI INC., Gyeonggi-do (KR)

(72) Inventors: You Seung Rim, Seoul (KR); Tai Young Kang, Gyeonggi-do (KR); Sin Su Kyoung, Gyeonggi-do (KR)

(73) Assignee: POWERCUBE SEMI INC., Gyeonggi-Do (KR)

( * ) Notice: Subject to any disclaimer, the term of this patent is extended or adjusted under 35 U.S.C. 154(b) by 276 days.

(21) Appl. No.: 17/612,831

(22) PCT Filed: Mar. 24, 2020

(86) PCT No.: PCT/KR2020/004013
§ 371 (c)(1),
(2) Date: Nov. 19, 2021

(87) PCT Pub. No.: WO2020/235796
PCT Pub. Date: Nov. 26, 2020

(65) Prior Publication Data
US 2022/0223746 A1   Jul. 14, 2022

(30) Foreign Application Priority Data
May 20, 2019   (KR) .......... 10-2019-0059050

(51) Int. Cl.
*H01L 29/872* (2006.01)
*H01L 29/06* (2006.01)
(Continued)

(52) U.S. Cl.
CPC ........ *H01L 29/872* (2013.01); *H01L 29/0619* (2013.01); *H01L 29/47* (2013.01); *H01L 29/66143* (2013.01)

(58) Field of Classification Search
CPC ... H01L 29/872; H01L 29/0619; H01L 29/47; H01L 29/66143; H01L 21/385;
(Continued)

(56) References Cited

U.S. PATENT DOCUMENTS 9,171,967 B2 * 10/2015 Takizawa .......... H01L 21/02433
2012/0009771 A1 * 1/2012 Cabral, Jr. ........ H01L 21/28518
                                                                438/581
(Continued)

FOREIGN PATENT DOCUMENTS

JP         01295459 A     11/1989
JP         2017112126 A    6/2017
(Continued)

*Primary Examiner* — Shahed Ahmed
*Assistant Examiner* — Khatib A Rahman
(74) *Attorney, Agent, or Firm* — Grossman, Tucker, Perreault & Pfleger, PLLC; Donald J. Perreault

(57) ABSTRACT

Schottky diode and method for fabricating the same disclosed. The Schottky diode includes a gallium oxide layer that is a semiconductor layer doped with a first-type dopant, a cathode in ohmic contact with the gallium oxide layer and an anode having a Schottky contact metal layer in Schottky contact with the gallium oxide layer. The gallium oxide layer is in contact with an interface with the Schottky contact metal layer, contains a second-type dopant of a conductivity opposite to that of the first-type dopant, and has an interlayer which is a region where a concentration of the second-type dopant decreases as it moves away from an interface with the Schottky contact metal layer.

9 Claims, 9 Drawing Sheets

(51) Int. Cl.
*H01L 29/47* (2006.01)
*H01L 29/66* (2006.01)

(58) Field of Classification Search
CPC ... H01L 21/44; H01L 29/24; H01L 29/66969; H01L 21/02293; H01L 21/2855; H01L 21/324; H01L 2924/01031
See application file for complete search history.

(56) References Cited

U.S. PATENT DOCUMENTS

| | | | | |
|---|---|---|---|---|
| 2012/0280281 | A1* | 11/2012 | Bahl | H01L 29/872 |
| | | | | 257/E29.338 |
| 2014/0124832 | A1* | 5/2014 | Ogura | H01L 29/66136 |
| | | | | 257/140 |
| 2016/0079085 | A1* | 3/2016 | Aoyama | H05B 3/0047 |
| | | | | 392/416 |
| 2020/0185541 | A1* | 6/2020 | Yuda | H01L 29/0619 |
| 2020/0227541 | A1* | 7/2020 | Yu | H01L 29/872 |

FOREIGN PATENT DOCUMENTS

| | | |
|---|---|---|
| JP | 2018170509 A | 11/2018 |
| KR | 1020080052325 | 6/2008 |
| KR | 1020140095080 A | 7/2014 |
| WO | 2018183374 A1 | 10/2018 |

* cited by examiner

SCHOTTKY DIODE AND METHOD FOR FABRICATING THE SAME

FIELD OF TECHNOLOGY

The present invention relates to a semiconductor device, and more particularly, to a Schottky diode.

BACKGROUND

A Schottky diode or a Schottky barrier diode is a device using a Schottky barrier generated by a junction of a metal and a semiconductor, and has a relatively low forward turn-on voltage and a fast switching speed compared to a diode having a PN junction. Schottky diode is used as a switching device of a power semiconductor device.

As such a Schottky diode, a SiC Schottky diode in which a SiC layer is formed by epitaxially growing SiC on a Si wafer, or a GaN Schottky diode in which a GaN layer is formed by epitaxially growing GaN on a Si wafer has been developed.

However, since the SiC Schottky diode has a large lattice mismatch with the Si wafer, it is difficult to grow a layer having a single crystal with few defects on the Si wafer. GaN Schottky diodes have a problem in that mass productivity is not good because crystal growth is difficult without going through a buffer layer such as AlN.

In order to solve this problem, a Schottky diode using a gallium oxide is being developed. Gallium oxide has the advantage of being able to manufacture an ingot at low cost while providing a sufficiently high breakdown voltage.

SUMMARY

The objective of the present invention is to provide a gallium oxide-based Schottky diode in which the turn-on voltage is increased and the leakage current is stable through the improvement of the Schottky barrier height.

The objectives of the present invention are not limited to those mentioned above, and other objectives not mentioned will be clearly understood by those skilled in the art from the following description.

In order to achieve the aforementioned technical objectives, one embodiment of the present invention provides a Schottky diode. The Schottky diode may include a gallium oxide layer that is a semiconductor layer doped with a first-type dopant, a cathode in ohmic contact with the gallium oxide layer and an anode having a Schottky contact metal layer in Schottky contact with the gallium oxide layer. The gallium oxide layer may be in contact with an interface with the Schottky contact metal layer, contain a second-type dopant of a conductivity opposite to that of the first-type dopant, and have an interlayer which is a region where a concentration of the second-type dopant decreases as it moves away from an interface with the Schottky contact metal layer.

In one embodiment, the second-type dopant may be the same metal as the metal contained in the Schottky contact metal layer. The Schottky contact metal layer and the interlayer may contain Ni, Co, or a combination thereof. In another embodiment, the Schottky contact metal layer may contain Se, Os, Rh, Co, Cu, Pd, Au, Ir, Pt, W, Ag, Ni, or a combination thereof, and the second-type dopant in the interlayer may contain Li, Na, Cs, Rb, Ca, Sr, Ba, Sc, Y, Ti, Zr, Hf, Ta, Fe, Co, Ni, Zn, Al, Nd, Sm, or a combination thereof.

The interlayer may have a wider width than that of the Schottky contact metal layer.

The gallium oxide layer may be $\beta$-$Ga_2O_3$ layer. The gallium oxide layer may include a first gallium oxide layer and a second gallium oxide layer doped at a lower concentration than that of the first gallium oxide layer, the cathode may be in ohmic contact with the first gallium oxide layer, the anode may be in Schottky contact with the second gallium oxide layer, and the interlayer may be located in the second gallium oxide layer. The second gallium oxide layer may be a layer epitaxially grown from the first gallium oxide layer. The first gallium oxide layer may be a Sn-doped gallium oxide layer and the second gallium oxide layer may be a Si-doped gallium oxide layer.

The Schottky diode may have a Schottky barrier height of 1.25 to 1.5 eV.

In order to achieve the aforementioned technical objectives, another embodiment of the present invention provides a method of manufacturing Schottky diode. The method of manufacturing a Schottky diode may include providing a gallium oxide layer that is a semiconductor layer doped with a first-type dopant, forming a cathode in contact with the gallium oxide layer, forming a Schottky contact metal layer in contact with the gallium oxide layer and annealing the gallium oxide layer on which the Schottky contact metal layer is formed to form an interlayer that is in contact with the the Schottky contact metal layer, contains a second-type dopant of a conductivity opposite to that of the first-type dopant, and is a region where a concentration of the second-type dopant decreases as it moves away from an interface with the Schottky contact metal layer.

In one embodiment, the Schottky contact metal layer may contain the second-type dopant, and the interlayer may be formed in the annealing by diffusing the second-type dopant contained in the Schottky contact metal layer into the gallium oxide layer. Schottky contact metal layer may be formed by sputtering. The Schottky contact metal layer contains Ni, Co, or a combination thereof as the second-type dopant. The Schottky contact metal layer is formed by using a facing target sputtering.

In another embodiment, prior to forming a Schottky contact metal layer in contact with the gallium oxide layer, a diffusion doping layer containing the second-type dopant may be formed on the gallium oxide layer, and the Schottky contact metal layer may be formed on the diffusion doping layer. The diffusion doping layer is formed by sputtering. The Schottky contact metal layer may contain Se, Os, Rh, Co, Cu, Pd, Au, Ir, Pt, W, Ag, Ni, or a combination thereof, and the second-type dopant in the interlayer may contain Li, Na, Cs, Rb, Ca, Sr, Ba, Sc, Y, Ti, Zr, Hf, Ta, Fe, Co, Ni, Zn, Al, Nd, Sm, or a combination thereof.

The annealing may be performed in a vacuum or an inert gas atmosphere. The annealing may be performed at 300 to 600° C. The annealing is performed by using a rapid thermal annealing. Schottky barrier height or a turn-on voltage of the Schottky diode may be increased by the annealing.

The gallium oxide layer may be $\beta$-$Ga_2O_3$ layer.

In order to achieve the aforementioned technical objectives, still another embodiment of the present invention provides a method of manufacturing Schottky diode. The method may include providing a gallium oxide layer that is an impurity semiconductor layer, forming a cathode in contact with the gallium oxide layer, forming a Schottky contact metal layer in contact with the gallium oxide layer and having magnetism by using a facing target sputtering and annealing the gallium oxide layer on which the Schottky contact metal layer is formed.

As described above, in the Schottky diode according to embodiments of the present invention, the turn-on voltage may increase and the leakage current may be stabilized through the improvement of the Schottky barrier height.

Hereinafter, a preferred example is presented to help the understanding of the present invention. However, the following examples are only for helping understanding of the present invention, and the present invention is not limited by the following examples.

BRIEF DESCRIPTION OF ACCOMPANYING DRAWINGS

Figure 15:
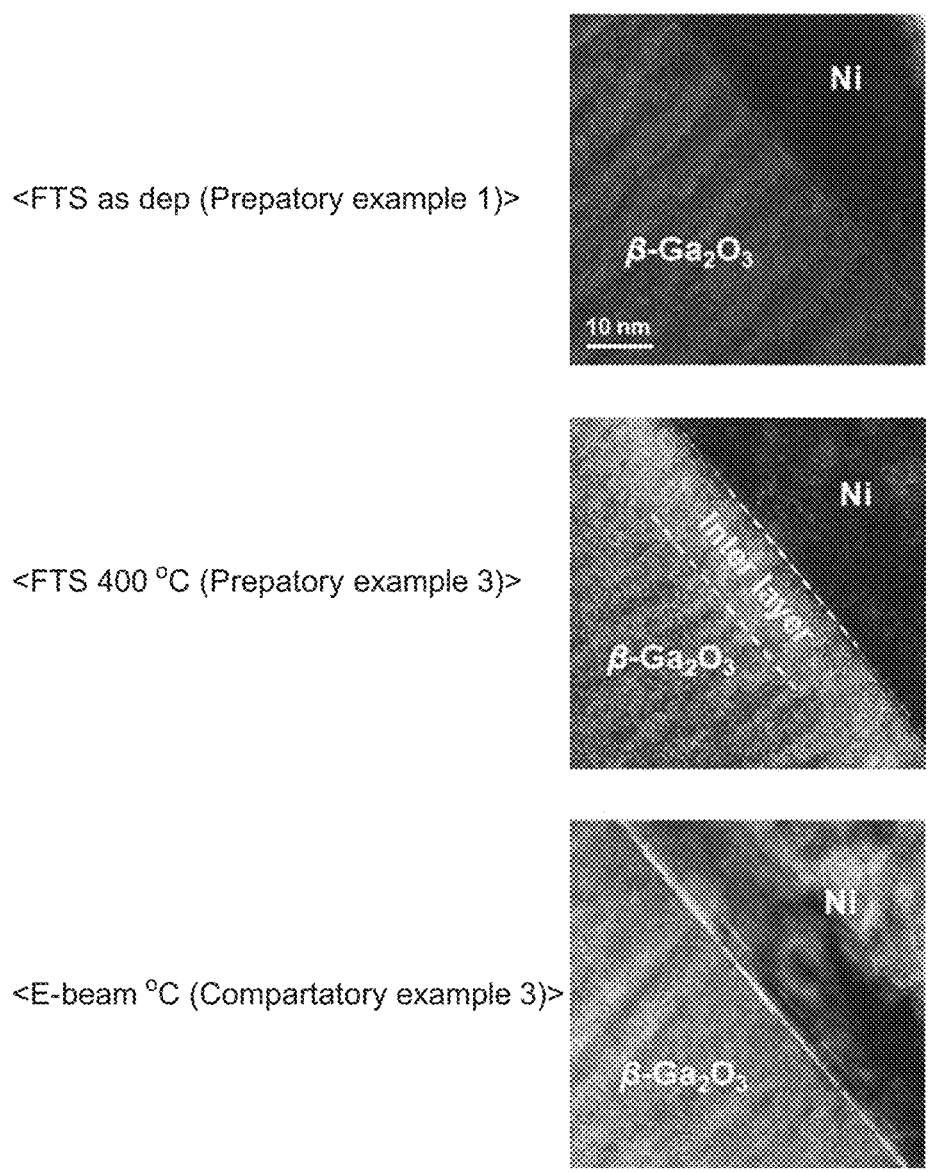
Figure 16:
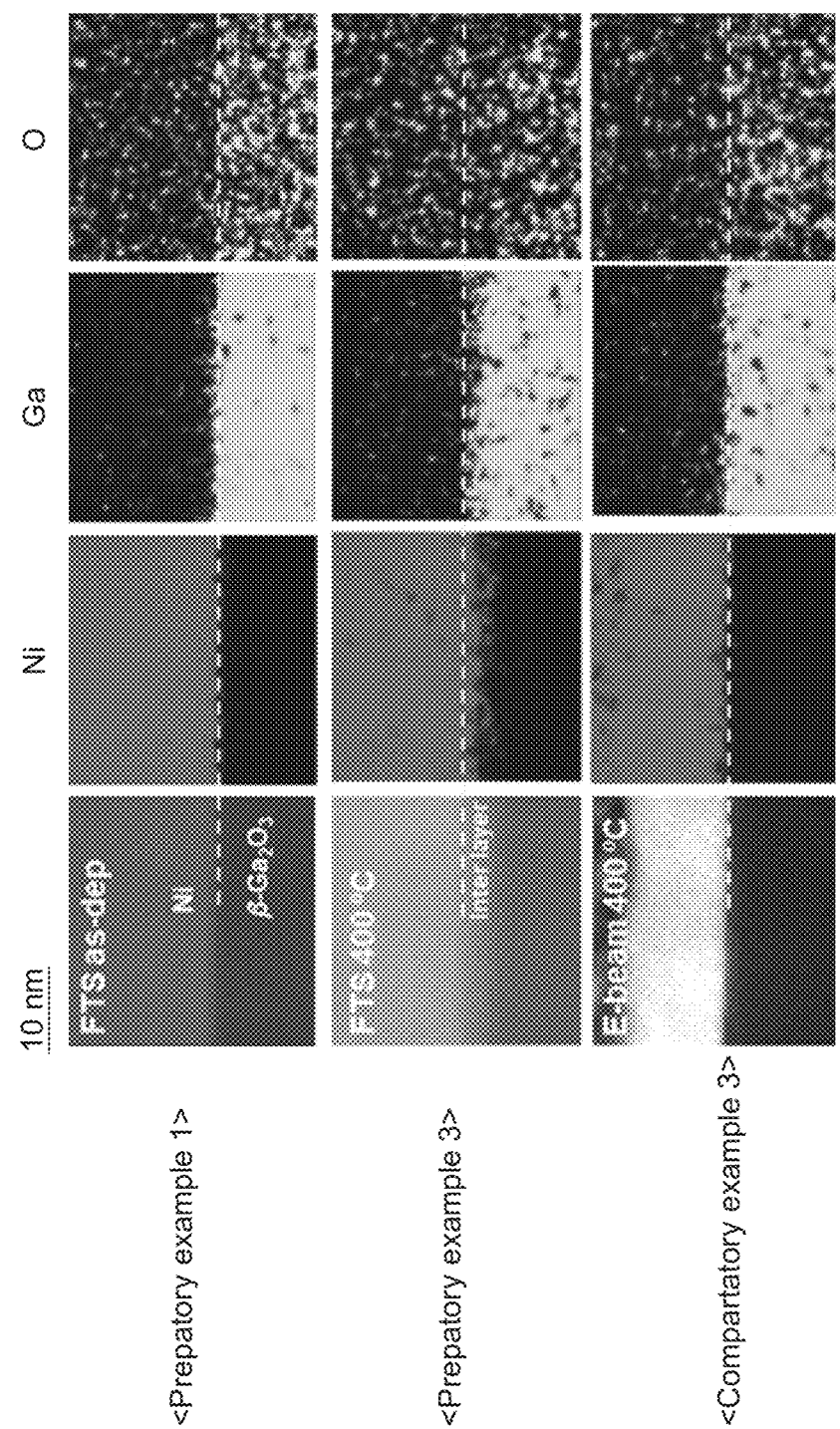

FIG. 15 shows cross-sections of Schottky diodes according to Preparatory example 1, Preparatory example 3, and comparative example 3 that are taken by a transmission electron microscope (TEM); and FIG. 16 shows cross-sections of Schottky diodes according to Preparatory example 1, Preparatory example 3, and comparative example 3 that are taken by an energy dispersive spectroscopy (EDS).

DETAILED DESCRIPTION

Hereinafter, embodiments according to the present invention will be described in more detail with reference to the accompanying drawings in order to describe the present invention in more detail. However, the present invention is not limited to the embodiments described herein and may be embodied in other forms. When a layer is referred to as being "on" another layer or substrate, it may be formed directly on the other layer or substrate, or a third layer may be interposed therebetween.

Figure 1:
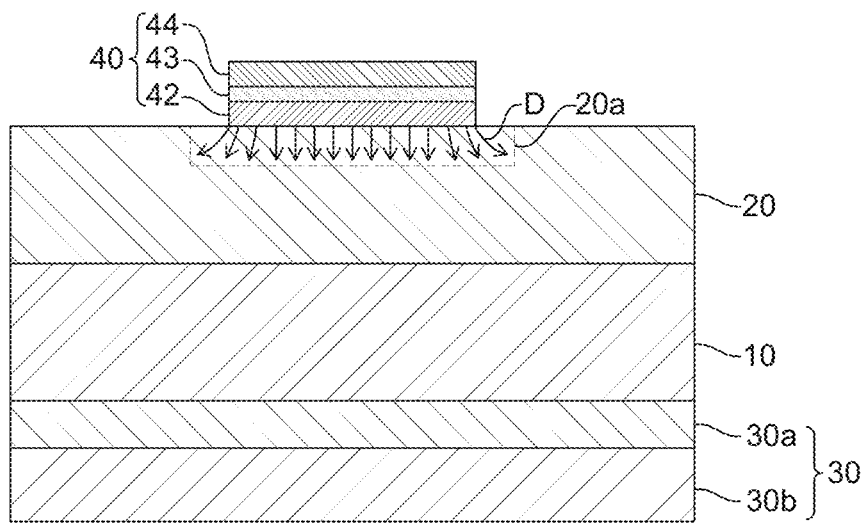
FIG. 1 and FIG. 2 are cross-sectional views illustrating a method of manufacturing a Schottky diode according to one embodiment of the present invention.
Figure 2:
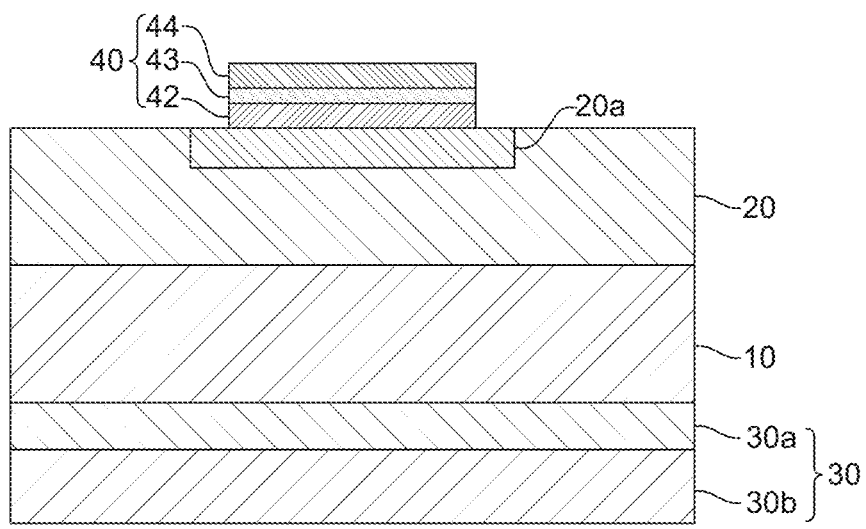

FIG. 1 and FIG. 2 are cross-sectional views illustrating a method of manufacturing a Schottky diode according to one embodiment of the present invention.

Referring to FIG. 1, a gallium oxide layer may be provided. The gallium oxide layer may be an extrinsic semiconductor layer doped with n-type or p-type dopant as an example of a first-type dopant, and include a first gallium oxide layer 10 and a second gallium oxide layer 20 doped at lower concentration than that of the first gallium oxide layer 10. The second gallium oxide layer 20 may be referred to as a drift layer. The first gallium oxide layer 10 and the second gallium oxide layer 20 are a single crystalline gallium oxide layer such as α, β, γ, δ, ε crystalline phases, and specifically β-$Ga_2O_3$ layer.

Both the first gallium oxide layer 10 and the second gallium oxide layer 20 are layers doped with n-type dopant, and the concentration of dopants in the first gallium oxide layer 10 may be about 100 to 500 times higher than that of the second gallium oxide layer 20. As n-type dopant, Si, Sn, or a combination thereof may be used. Specifically, the first gallium oxide layer 10 may be a Sn-doped gallium oxide layer, and the second gallium oxide layer 20 may be a Si-doped gallium oxide layer.

The first gallium oxide layer 10 may be a gallium oxide substrate, which is obtained by cutting a bulk crystal formed using a melt growth method or the like. The first gallium oxide layer 10 may have a thickness of several hundred micrometers, specifically, a thickness of about 500 to 1000 μm. The second gallium oxide layer 20 is a layer epitaxially grown from the upper surface of the first gallium oxide layer 10 by, specifically, a physical vapor deposition (PVD) method, a pulsed laser deposition (PLD) method, and an MBE (It may be a layer grown using a molecular beam epitaxy) method, a metal-organic chemical vapor deposition (MOCVD) method, or a hydrogen vapor phase epitaxy (HVPE) method. The second gallium oxide layer 20 may have a thickness of about 5 to 10 um.

A cathode electrode 30 in ohmic contact with the first gallium oxide layer 10 may be disposed. As an example, the cathode electrode 30 may be disposed on the lower surface of the first gallium oxide layer 10. The cathode electrode 30 may have a double-layer structure of an ohmic contact metal layer 30a and a cathode low-resistance layer 30b having a lower resistance compared thereto. The ohmic contact metal layer 30a may be made of titanium (Ti), indium (In), or a combination thereof. The cathode low-resistance layer 30b may be gold (Au), aluminum (Al), or a combination thereof.

An anode electrode 40 in Schottky contact with the second gallium oxide layer 20 may be disposed on the second gallium oxide layer 20. The anode electrode 40 may include a Schottky contact metal layer 42, which is a metal layer having a high work function compared to an electron affinity of the second gallium oxide layer 20, for example 4.4 to 6 eV, specifically 5 eV or more. The Schottky contact metal layer 42 may be Se, Os, Rh, Co, Cu, Pd, Au, Ir, Pt, W, Ag, Ni, or a combination thereof. Furthermore, the anode electrode 40 may further include an anode low-resistance layer 44, which has a lower resistance than the Schottky contact metal layer 42, on the Schottky contact metal layer 42. The anode low-resistance layer 44 may be gold (Au), aluminum (Al), or a combination thereof. In another example, a diffusion barrier layer 43 may be further disposed between the Schottky contact metal layer 42 and the anode low resistance layer 44. The diffusion barrier layer 43 may be a titanium (Ti) or TIN layer. The anode electrode 40 may be patterned using a lift-off method or a photolithography method.

The Schottky contact metal layer 42 may be formed using sputtering, specifically, a facing target sputtering method. In particular, when the Schottky contact metal layer is a metal having magnetic properties, as an example of a ferromagnetic material such as Ni, Co, or a combination thereof, it can be formed using the facing target sputtering method, and in this case, the high quality Schottky contact metal layer may be formed with high sputtering yield by minimizing ion bombardment that may occur due to the secondary electrons during a film formation and maintaining high plasma density by forming a magnetic confinement.

The element formed up to the anode electrode 40 may be annealed. This annealing may be performed in a vacuum or an inert gas atmosphere, and may be performed at about 200 to 600° C., specifically 300 to 600° C., more specifically 350 to 450° C. In addition, this annealing may be performed using a rapid thermal annealing (RTA) method.

During the annealing, the second-type dopant, for example, p-type dopant such as Ni, Co, or a combination thereof may be diffused into the second gallium oxide layer 20 in contact therewith. The second-type dopant constitutes the Schottky contact metal layer 42 that is formed by using the facing target sputtering method included in the anode electrode 40 and has a conductivity type opposite to the first-type dopant.

Referring to FIG. 2, an interlayer 20a may be formed by diffusion of the metal constituting the Schottky contact metal layer 42. The interlayer 20a may be formed to have a wider width than that of the anode electrode 40, that is, the Schottky contact metal layer 42. In other words, the second gallium oxide layer 20 may include the interlayer 20a that is in contact with the interface with the Schottky contact metal layer 42 and is a region in which the same metal as the second-type dopant is diffused, dispersed or doped. The interlayer 20a may have a thickness of about 5 to 20 nm, for example, 8 to 15 nm. In addition, in the interlayer 20a, the metal, which is the same second dopant as the metal contained in the Schottky contact metal layer 42, may have a lower concentration as it moves away from the interface with the Schottky contact metal layer 42. As such, the metal constituting the Schottky contact metal layer 42 in the interlayer 20a, that is, the second-type dopant may have a concentration gradient.

When the metal constituting the Schottky contact metal layer 42 is Ni, Co, or a combination thereof that is the second-type dopant, that is, a p-type dopant, the Schottky barrier height may be increased due to the formed interlayer 20a. Specifically, the Schottky diode according to the present embodiment may exhibit a Schottky barrier height of about 1.25 to 1.5 eV, specifically 1.3 to 1.4 eV. Also, due to the formed interlayer 20a, a turn-on voltage may increase, a breakdown voltage may increase and a leakage current may decrease.

Figure 3:
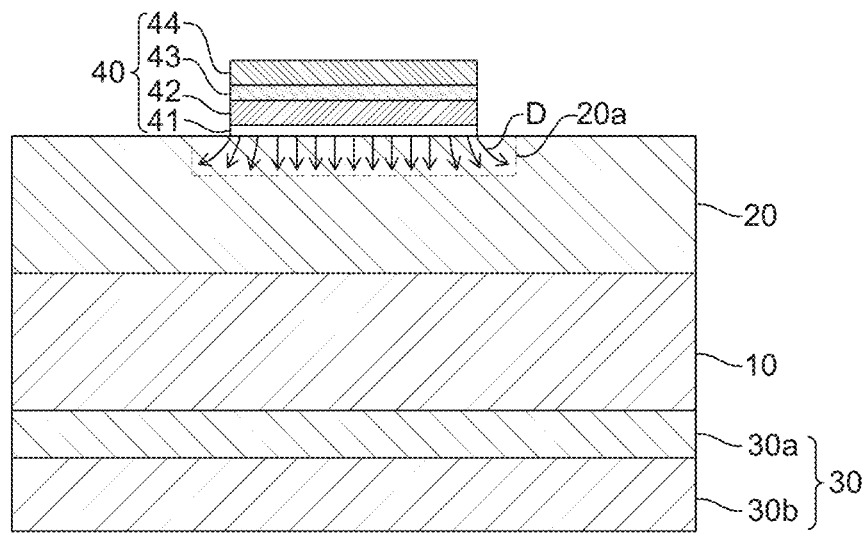
FIG. 3 is a cross-sectional view illustrating a method of manufacturing a Schottky diode according to another embodiment of the present invention.

FIG. 3 is a cross-sectional view illustrating a method of manufacturing a Schottky diode according to another embodiment of the present invention. The method of manufacturing the Schottky diode according to the present embodiment may be similar to the method of manufacturing the Schottky diode described with reference to FIGS. 1 and 2 except as described later.

Referring to FIG. 3, the anode electrode 40 in Schottky contact with the second gallium oxide layer 20 may be disposed on the second gallium oxide layer 20. As described with reference to FIG. 1, the anode electrode 40 may include the Schottky contact metal layer 42, the diffusion barrier layer 43, and the anode low resistance layer 44. The anode low-resistance layer 44 and/or the diffusion barrier layer 43 may be omitted in some cases. The Schottky contact metal layer 42 is a metal layer having a high work function compared to the electron affinity of the second gallium oxide layer 20, for example 4.4 to 6 eV, specifically, a metal layer having a work function of 5 eV or more. The Schottky contact metal layer 42 may be Se, Os, Rh, Co, Cu, Pd, Au, Ir, Pt, W, Ag, Ni, or a combination thereof. A diffusion doping layer 41 may be formed below the anode electrode 40, specifically, between the Schottky contact metal layer 42 and the second gallium oxide layer 20. The diffusion doping layer 41 may be a layer formed of the p-type dopant as an example of the second-type dopant, specifically, Li, Na, Cs, Rb, Ca, Sr, Ba, Sc, Y, Ti, Zr, Hf, Ta, Fe, Co, Ni, Zn, Al, Nd, Sm, or a combination thereof. The diffusion doping layer 41 may be formed using the sputtering method, and may be formed to have a very thin thickness, for example, several angstroms or several nanometers. As an example, when the diffusion doping layer 41 is a layer formed of Fe, Co, Ni, Nd, Sm, or a combination thereof that has magnetic properties, it may be formed using the facing target sputtering method.

The element formed up to the anode 40 may be annealed. This annealing may be performed in a vacuum or an inert gas atmosphere, and may be performed at about 200 to 600° C., specifically 300 to 600° C., more specifically 350 to 450° C. In addition, this annealing may be performed using a rapid thermal annealing (RTA) method.

In the annealing process, the metal constituting the diffusion doping layer 41, that is, the p-type dopant may be completely diffused (D) into the second gallium oxide layer 20 in contact therewith. As a result, the interlayer (20a in FIG. 2) may be formed by diffusion, dispersion, or doping of the metal constituting the diffusion doping layer 41. In addition, as the metal constituting the diffusion doping layer 41 is completely diffused (D) into the second gallium oxide layer 20 in contact therewith, the interlayer (20a in FIG. 2) and the Schottky contact metal layer 42 may be contacted to form the Schottky contact.

In addition, in the interlayer (20a in FIG. 2), the metal contained in the diffusion doping layer 41, that is, the p-type dopant meta, may have a lower concentration as it moves away from the interface with the Schottky contact metal layer 42. As such, the metal contained in the diffusion doping layer 41 in the interlayer 20a, that is, the p-type dopant may have a concentration gradient. In other words, in the interlayer (20a in FIG. 2), the n-type carrier concentration in the second gallium oxide layer 20 may have a higher concentration as it moves away from the interface with the Schottky contact metal layer 42.

The Schottky barrier height may be increased by the interlayer (20a in FIG. 2) formed with the metal that had been contained in the diffusion doping layer 41 to be diffused into the second gallium oxide layer 20. Specifically, the Schottky diode according to the present embodiment may exhibit the Schottky barrier height of about 1.25 to 1.5 eV, specifically 1.3 to 1.4 eV. In addition, due to the formed interlayer (20a in FIG. 2), the turn-on voltage may increase, the breakdown voltage may increase and the leakage current may decrease.

Hereinafter, a preferred experimental example is presented to help the understanding of the present invention. However, the following examples are only for helping understanding of the present invention, and the present invention is not limited by the following examples.

Preparatory Example 1 of Schottky Diode

On the upper surface of a beta-gallium oxide wafer with a thickness of about 650 um doped with Sn at a concentration of about $10^{18}$ atmos/cm$^{-3}$, a beta-gallium oxide epitaxial layer doped with Si at a concentration of about $10^{16}$ atmos/cm$^{-3}$ was grown to a thickness of about 5 μm using HVPE (Halid Vapor Phase Epitaxy). A Ti/Au electrode was formed by stacking a Ti layer of about 10 nm and an Au layer of about 40 nm on the lower surface of the beta-gallium oxide wafer using an E-beam evaporator. A Ni layer of about 300 nm was deposited on the beta-gallium oxide epitaxial layer using a facing target sputtering method.

Preparatory Examples 2 to 4 of Schottky Diode

After forming the Ni layer, RTA (Rapid thermal annealing) was performed for 1 minute in an Ar gas atmosphere of 100 mTorr at 200° C., 400° C., or 600° C. to the Schottky diodes that are the same as Preparatory example 1.

Comparative Example 1 of Diode

A Schottky diode was manufactured using the same method as in Preparatory example 1 of Schottky diode, except that an about 300 nm Ni layer was deposited on the beta-gallium oxide epitaxial layer using the electron beam evaporator.

Comparative Examples 2 to 4 of Schottky Diode

After forming the Ni layer, RTA was performed for 1 minute at 200° C. (Comparative Example 2), 400° C. (Comparative Example 3), or 600° C. (Comparative Example 4) in an Ar gas atmosphere of 100 mTorr to the Schottky diodes that are the same as Comparative example 1.

FIG. 4, FIG. 5, FIG. 6 and FIG. 7 are graphs showing current density-voltage (J-V) of Schottky diodes according to Preparatory examples and Comparative examples. Specifically, (a) is a forward bias J-V graph of Schottky diodes according to Preparatory Examples 1 to 4, (b) is a reverse bias J-V graph of Schottky diodes according to Preparatory Examples 1 to 4, (c) is a forward bias J-V graph of Schottky diodes according to Comparative Examples 1 to 4, and (b) is a reverse bias J-V graph of Schottky diodes according to Comparative Examples 1 to 4.

Figure 4:
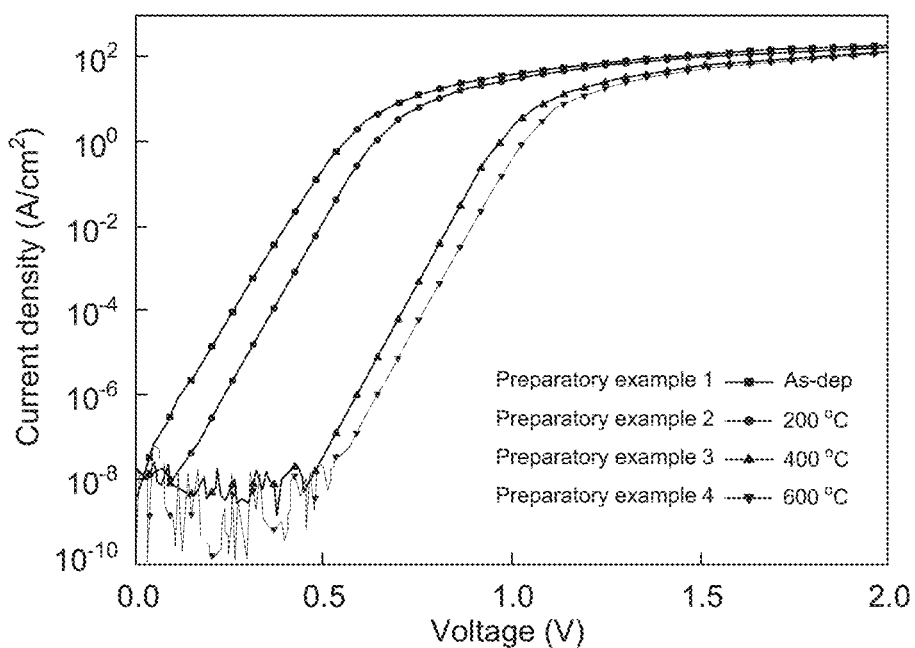
FIG. 4, FIG. 5, FIG. 6 and FIG. 7 are graphs showing current density-voltage (J-V) of Schottky diodes according to Preparatory examples and comparative examples.
Figure 5:
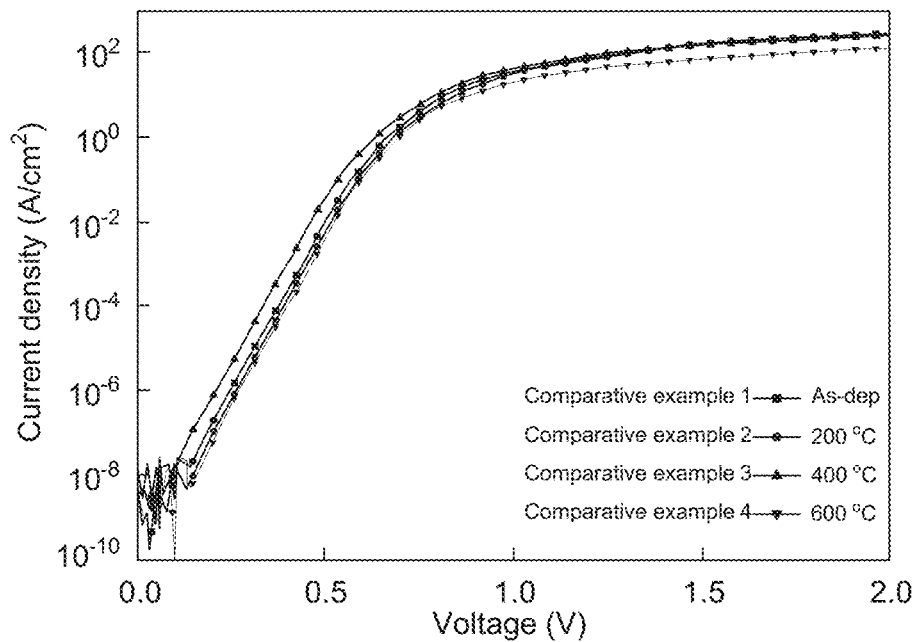
Figure 6:
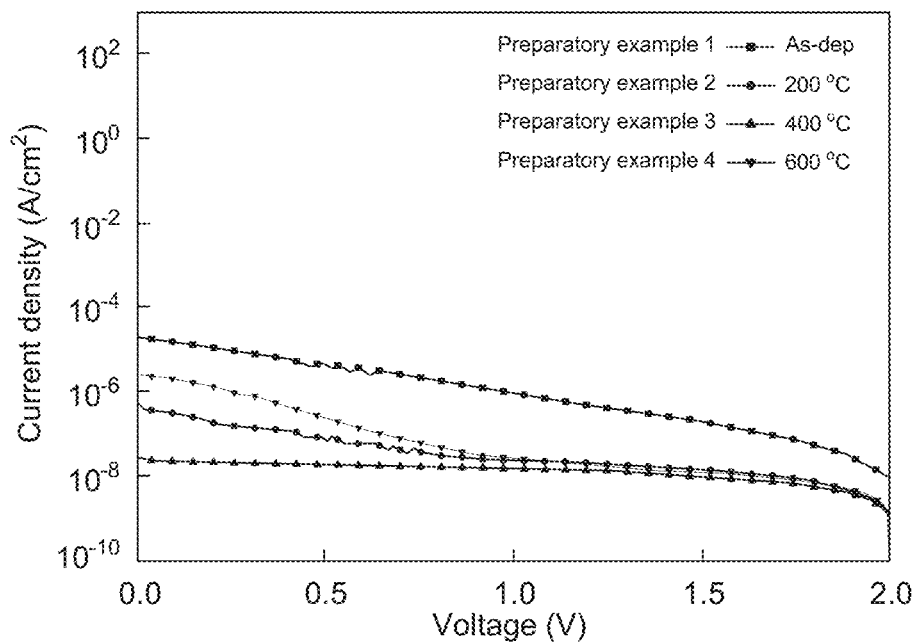
Figure 7:
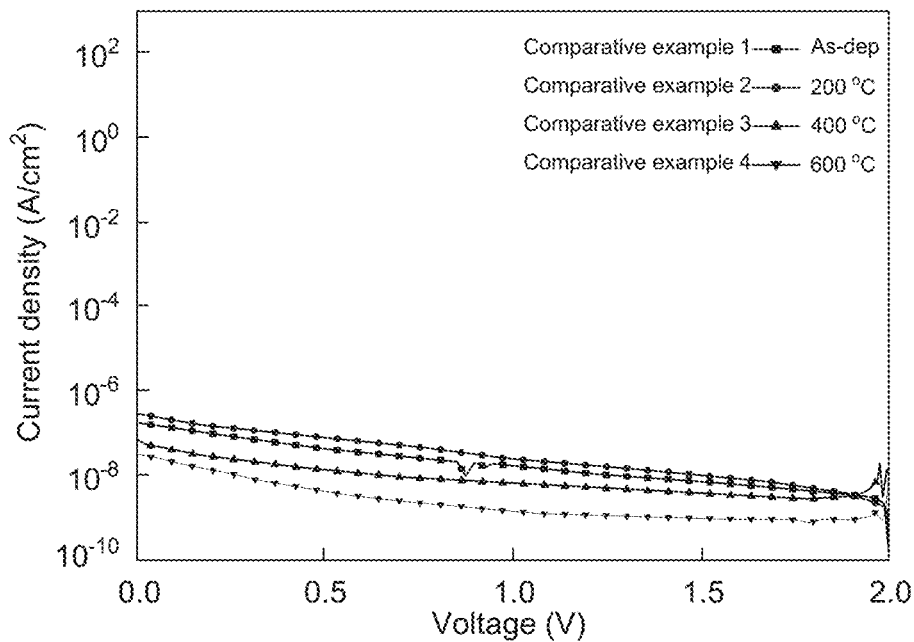

Referring to FIGS. 4 to 7, in Preparatory examples, it can be seen that the turn-on voltage of the positive bias region shifts to the right as the annealing temperature increases, and specifically in FIG. 4 showing J-V of diode annealed at 400° C., a large shift in the turn-on voltage can be seen. In addition, in FIG. 6, it can be seen that when the annealing temperature is increased up to 400° C. in the Preparatory examples, the leakage current value of the reverse bias region is gradually lowered, but when the annealing temperature is 600° C., it can be seen that the leakage current value is increased again. On the contrary, in the case of Comparative Examples in FIG. 5, the change in the turn-on voltage of the forward bias region according to the annealing temperature change is small, and in FIG. 7, it can be seen that the change in the leakage current value of the reverse bias region is also small.

Figure 8:
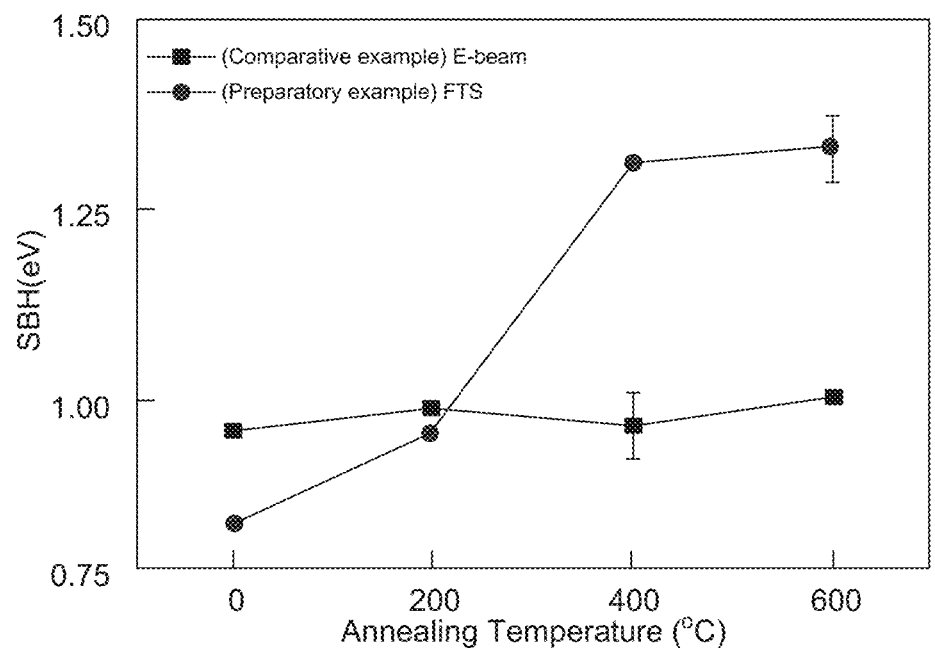
FIG. 8, FIG. 9 and FIG. 10 are graphs showing Schottky barrier height (SBH) (a), ideal factor (n) (b), and the on-resistance value (c)
Figure 9:
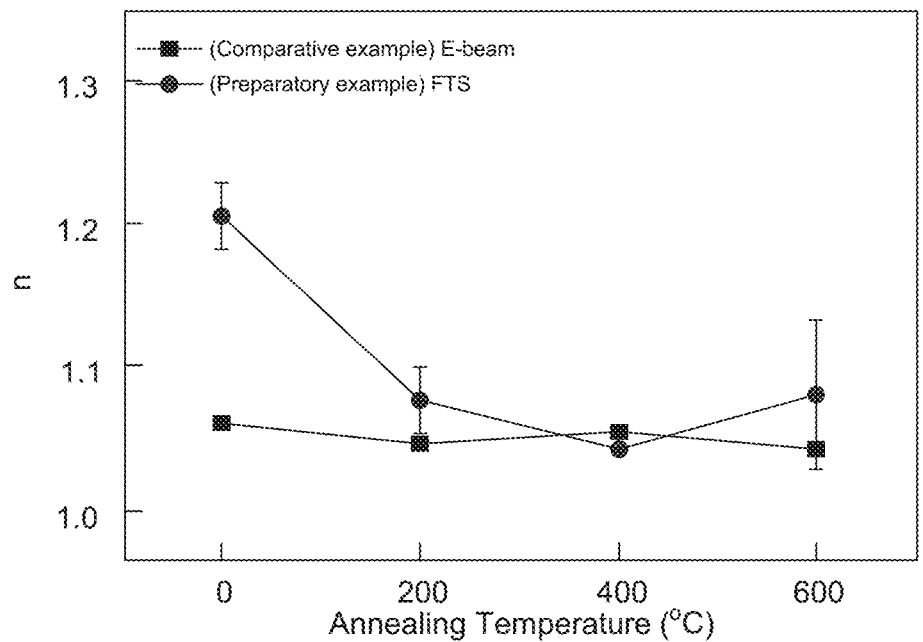
Figure 10:
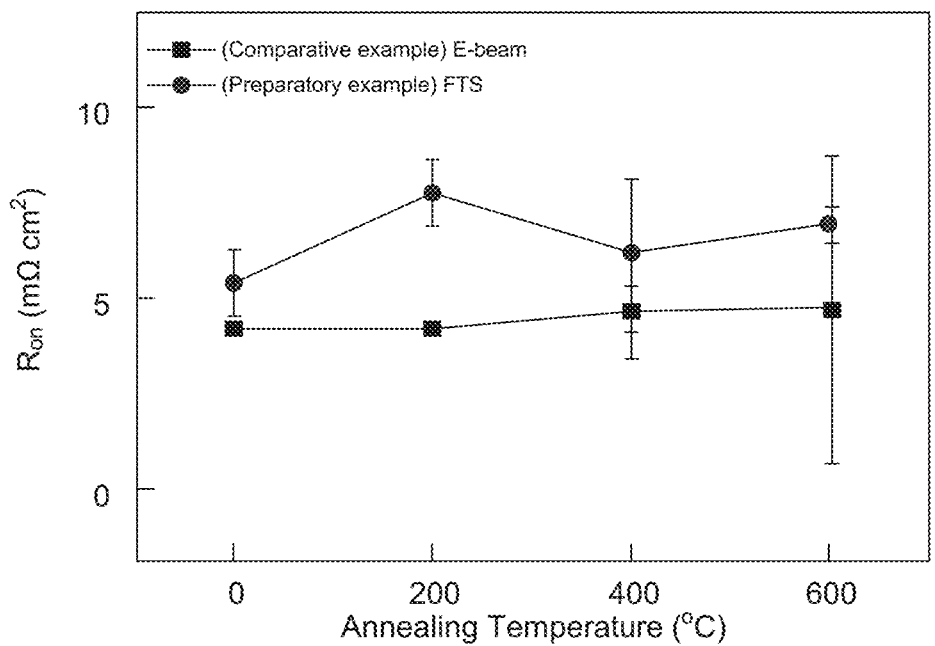

FIG. 8 is a graph showing Schottky barrier heights SBH of Preparatory examples and Comparative examples, FIG. 9 is a graph showing ideal factor n, and FIG. 10 is a graph showing on-resistance value In addition, various characteristics of Schottky diodes according to Preparatory Examples 1 to 4 are summarized in Table 1 below.

TABLE 1

| | Annealing temp. | SBH (eV) | Ideal factor n | On-resistance (mΩ · cm$^2$) | Turn-on voltage (V) | Breakdown voltage (V) |
|---|---|---|---|---|---|---|
| Preparatory example 1 | — | 0.85 | 1.18 | 5.44 | 0.85 | — |
| Preparatory example 2 | 200° C. | 0.96 | 1.07 | 7.72 | 0.79 | — |
| Preparatory example 3 | 400° C. | 1.31 | 1.05 | 6.27 | 1.11 | −444 |
| Preparatory example 4 | 600° C. | 1.36 | 1.08 | 6.96 | 1.11 | −444 |

Referring to FIGS. 8 to 10 and Table 1, in FIG. 8, SBH increases as the annealing temperature increases up to 400° C., but at subsequent temperatures, the increase in the Schottky barrier height is insignificant and values of about 1.25 to 1.5 eV, specifically, a value of 1.3 to 1.4 eV, were seen in Preparatory examples. SBH according to the annealing temperature showed little change at 1 eV or less in Comparative examples. On the other hand, in FIG. 9, the ideal coefficient n approaches the ideal value of 1 as the annealing temperature is increased up to 400° C., and is slightly increased when the annealing was performed at 600° C. in Preparatory examples, which is about 1.01 to 1.1, specifically, about 1.03 to 1.09. On the other hand, Comparative examples exhibited an ideal coefficient of about 1.05 regardless of the annealing temperature.

In FIG. 10, the on-resistance slightly increases as the annealing temperature increases in Preparatory examples, but the increase was insignificant. Comparative examples show similar on-resistance regardless of the annealing temperature.

FIGS. 11 to 14 are current density-voltage J-V graphs according to a change in temperature during measurement of Schottky diodes of Preparatory Example 3 and Comparative Example 3, respectively.

Figure 11:
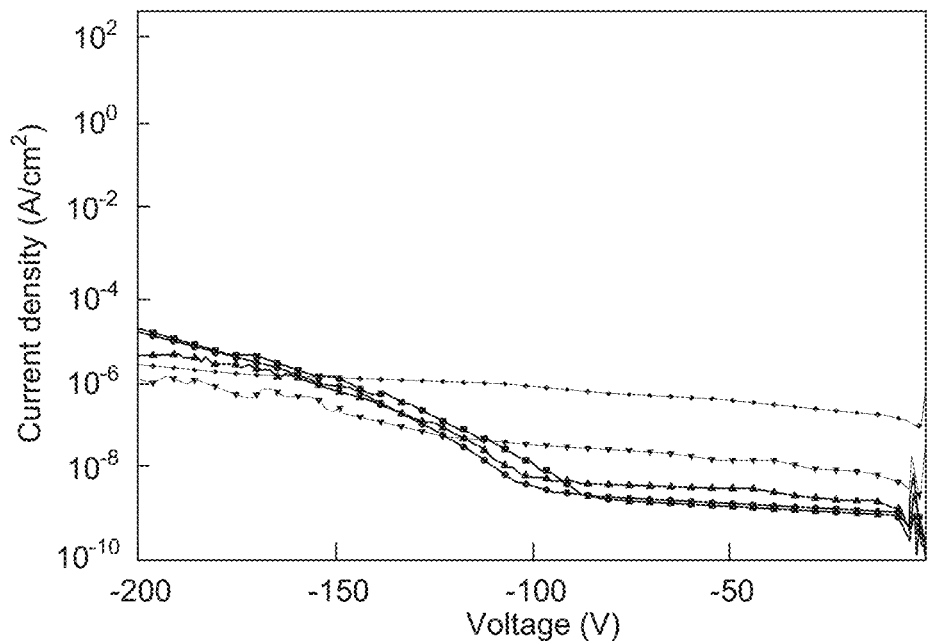
FIG. 11 and FIG. 12 are graphs showing current density-voltage (J-V) according to a change in temperature during measurement of Schottky diodes of Preparatory example 3.
Figure 12:
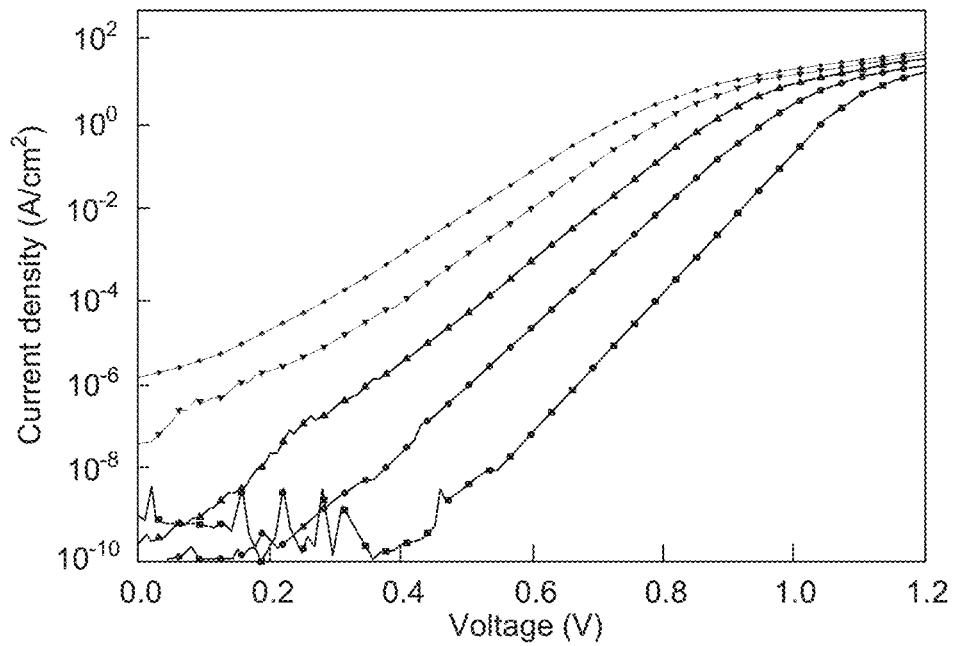

Referring to FIGS. 11 and 12 together, in the Schottky diode according to Preparatory Example 3, the initial leakage current in the reverse bias region increases as the measurement temperature increases, but in FIG. 11, when the measurement temperature was 175° C. or higher, the increase in leakage current decreased as the voltage increased. Meanwhile, in FIG. 12, it can be seen that the turn-on voltage moves to the left and the slope decreases as the measurement temperature increases in the positive bias region.

Figure 13:
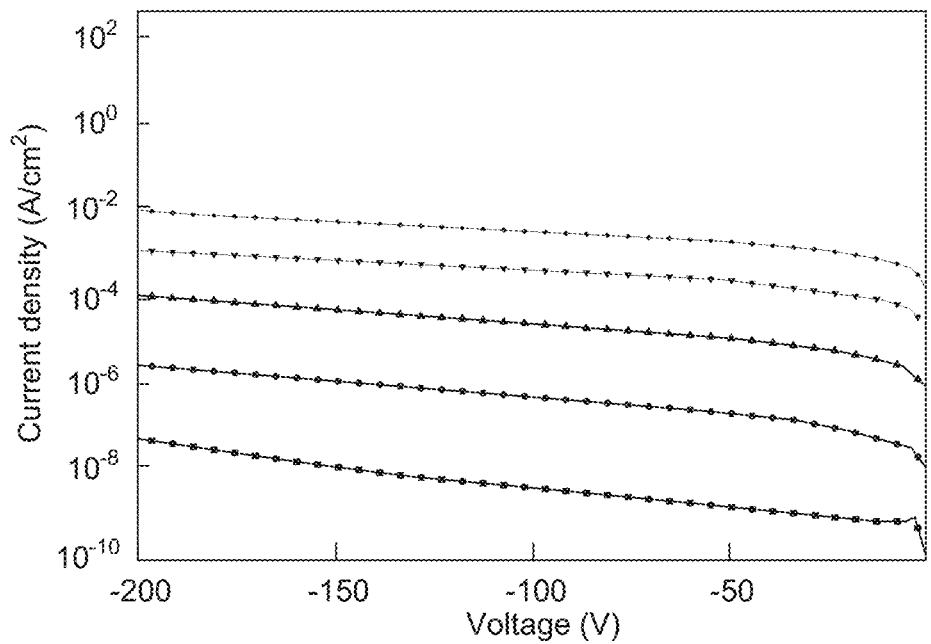
FIG. 13 and FIG. 14 are graphs showing current density-voltage (J-V) according to a change in temperature during measurement of Schottky diodes of comparative example 3.
Figure 14:
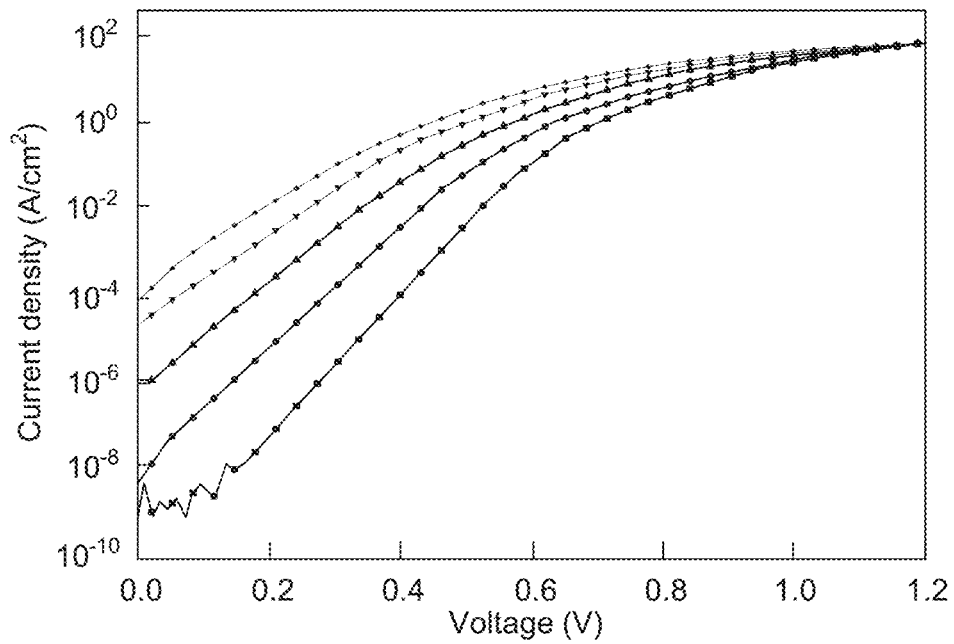

Referring to FIGS. 13 and 14 together, it can be seen that the Schottky diode according to Comparative Example 3 has poor temperature characteristics compared to the Schottky diode according to Preparatory Example 3, such as the increase in leakage current as the temperature increases.

FIG. 15 shows cross-sections of Schottky diodes according to Preparatory Example 1, Preparatory Example 3, and Comparative Example 3 that are taken by a transmission electron microscope (TEM). FIG. 16 shows cross-sections of Schottky diodes according to Preparatory example 1, Preparatory example 3, and comparative example 3 that are taken by an energy dispersive spectroscopy (EDS).

Referring to FIGS. 15 and 16, when the Ni layer is formed using the facing target sputtering method, unlike before the annealing (Preparatory Example 1), after the annealing at 400° C. (Preparatory Example 3), it can be seen that the interlayer with a thickness of about 10 nm is generated in the interface between the Ni layer and the gallium oxide epitaxial layer, specifically, in the gallium oxide epitaxial layer. Referring to the EDS component analysis result (FIG. 6(b)), this interlayer is a layer formed by diffusion of Ni into the gallium oxide epitaxial layer during the annealing process, and it can be seen that Ni has a lower concentration as it goes deeper into the gallium oxide epitaxial layer from the surface (interface with the Ni layer). In this way, in a device formed using the facing target sputtering method and annealed at 400° C., it can be seen that the layer doped with Ni, that is, the interlayer, is formed in the gallium oxide epitaxial layer in contact with the Ni layer, and Ni has a concentration gradient in the interlayer. As described above, the interlayer may serve to increase the Schottky barrier height and increase the breakdown voltage, and the like.

On the other hand, it can be seen that even when the Ni layer is formed using the electron beam evaporator and annealed at 400° C., diffusion of Ni does not occur between the Ni layer and the gallium oxide epitaxial layer, so that the interlayer is not formed.

In the above, the present invention has been described in detail with reference to preferred embodiments, but the present invention is not limited to the above embodiments, and various modifications and changes can be made by those skilled in the art within the technical spirit and scope of the present invention.

What is claimed is:

1. A Schottky diode, comprising:
   a gallium oxide layer that is a semiconductor layer doped with a first-type dopant;
   a cathode in ohmic contact with the gallium oxide layer; and
   an anode having a Schottky contact metal layer in Schottky contact with the gallium oxide layer,
   wherein the gallium oxide layer is in contact with an interface with the Schottky contact metal layer, contains a second-type dopant of a conductivity opposite to that of the first-type dopant, and has an interlayer which is a region where a concentration of the second-type dopant decreases as it moves away from an interface with the Schottky contact metal layer, the interlayer having a wider width than that of the Schottky contact metal layer.

2. The Schottky diode according to claim 1, wherein the second-type dopant is the same metal as the metal contained in the Schottky contact metal layer.

3. The Schottky diode according to claim 2, wherein the Schottky contact metal layer and the interlayer contain Ni, Co, or a combination thereof.

4. The Schottky diode according to claim 1, wherein the Schottky contact metal layer contains Se, Os, Rh, Co, Cu, Pd, Au, Ir, Pt, W, Ag, Ni, or a combination thereof,
   wherein the second-type dopant in the interlayer contains Li, Na, Cs, Rb, Ca, Sr, Ba, Sc, Y, Ti, Zr, Hf, Ta, Fe, Co, Ni, Zn, Al, Nd, Sm, or a combination thereof.

5. The Schottky diode according to claim 1, wherein the gallium oxide layer is $\beta$-$Ga_2O_3$ layer.

6. The Schottky diode according to claim 1, wherein the gallium oxide layer comprises a first gallium oxide layer and a second gallium oxide layer doped at a lower concentration than that of the first gallium oxide layer,
   wherein the cathode is in ohmic contact with the first gallium oxide layer,
   wherein the anode is in Schottky contact with the second gallium oxide layer,
   wherein the interlayer is located in the second gallium oxide layer.

7. The Schottky diode according to claim 6, wherein the second gallium oxide layer is a layer epitaxially grown from the first gallium oxide layer.

8. The Schottky diode according to claim 6, wherein the first gallium oxide layer is a Sn-doped gallium oxide layer and the second gallium oxide layer is a Si-doped gallium oxide layer.

9. The Schottky diode according to claim 1, wherein the Schottky diode has a Schottky barrier height of 1.25 to 1.5 eV.

* * * * *